(12) United States Patent
Speers

(10) Patent No.: US 7,459,772 B2
(45) Date of Patent: Dec. 2, 2008

(54) FACE-TO-FACE BONDED I/O CIRCUIT DIE AND FUNCTIONAL LOGIC CIRCUIT DIE SYSTEM

(75) Inventor: Theodore Speers, San Jose, CA (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 10/955,929

(22) Filed: Sep. 29, 2004

(65) Prior Publication Data

US 2006/0071332 A1    Apr. 6, 2006

(51) Int. Cl.
    *H01L 21/44* (2006.01)
(52) U.S. Cl. ...................................... 257/686
(58) Field of Classification Search ............... 257/686, 257/724, 734, 690, 777, E21.002
    See application file for complete search history.

(56) References Cited

U.S. PATENT DOCUMENTS

| | | | |
|---|---|---|---|
| 6,255,729 | B1 | 7/2001 | Oikawa |
| 6,624,046 | B1* | 9/2003 | Zavracky et al. ............ 438/455 |
| 6,914,259 | B2 | 7/2005 | Sakiyama et al. |
| 7,148,563 | B2* | 12/2006 | So et al. ..................... 257/685 |
| 7,242,093 | B2 | 7/2007 | Ueda |
| 2001/0040281 | A1* | 11/2001 | Butler ........................ 257/686 |
| 2002/0004932 | A1 | 1/2002 | Shau |
| 2002/0008309 | A1* | 1/2002 | Akiyama .................... 257/686 |
| 2002/0017718 | A1 | 2/2002 | Hikita et al. |
| 2002/0070438 | A1* | 6/2002 | Ference et al. .............. 257/685 |
| 2004/0000705 | A1* | 1/2004 | Huppenthal et al. ......... 257/685 |
| 2005/0205983 | A1 | 9/2005 | Origasa et al. |
| 2005/0224942 | A1 | 10/2005 | Ho |
| 2005/0269663 | A1* | 12/2005 | Minami et al. .............. 257/510 |
| 2006/0038273 | A1* | 2/2006 | Lu et al. ..................... 257/686 |
| 2006/0237833 | A1 | 10/2006 | Klein et al. |

FOREIGN PATENT DOCUMENTS

| | | |
|---|---|---|
| WO | 2006039254 A2 | 4/2006 |
| WO | 2006039254 A3 | 4/2006 |

OTHER PUBLICATIONS

T. Makimoto, Ph. D., "New Opportunities in the Chip Industry", Semico Summit 2004, Scottsdale, Arizona, 40 pages, Mar. 14-16, 2004.
Anonymous, "3D Integration for Mixed Signal Applications", Ziptronix, Inc., 4 pages, 2002, no month.
Anonymous, "Benefits of 3D Integration in Digital Imaging Applications", Ziptronix, Inc., 3 pages, 2002, no month.
Co-pending U.S. Appl. No. 11/171,488, filed Jun. 29, 2005, entitled Architecture for Face-to-Face Bonding Between Substrate and Multiple Daughter Chips.

* cited by examiner

*Primary Examiner*—Nathan W Ha
(74) *Attorney, Agent, or Firm*—Lewis and Roca LLP

(57) ABSTRACT

An integrated circuit system includes a first set of integrated circuit dice each member of the set having a different configuration of input/output circuits disposed thereon and a second set of integrated circuit dice each having different logical function circuits disposed thereon. Each member of the first and second sets of integrated circuit dice include an array of face-to-face bonding pads disposed thereon that mate with the array of face-to-face bonding pads of each member of the other set.

19 Claims, 4 Drawing Sheets

FACE-TO-FACE BONDED I/O CIRCUIT DIE AND FUNCTIONAL LOGIC CIRCUIT DIE SYSTEM

BACKGROUND

1. Field of the Invention

The present invention relates to integrated circuit technology. More particularly, the present invention relates to an integrated circuit system including mating sets of face-to-face integrated circuit dice.

2. The Prior Art

As process geometries scale, the portion of the area of digital-logic function integrated circuits such as field-programmable-gate-array (FPGA) integrated circuits and mixed digital and analog function integrated circuits that must be devoted to input/output circuits (I/O) represents an increasing percentage of the die area relative to logic gates. A secondary cost issue is that often customers may need a significant amount of I/O and not many gates. Presently, such customers end up paying for un-needed gates in order to obtain needed I/O. The reverse is true as well. This represents an opportunity to deliver a more cost-effective product to customers.

Another problem is that some manufacturers envision creating a number of system-on-a-chip (SOC) integrated circuits and derivatives that employ FPGA and other programmable logic technology. These derivatives will have varying quantities and functions of analog peripherals depending on application. Many variations of analog peripherals are envisioned. In addition, the number of FPGA gates needed for each set of peripherals will be customer dependent, again creating a situation where the customer is paying for un-needed gates.

The industry has not come up with a good solution for the I/O problem to date. The current trend is to offer several variations of products with different combinations of I/O structures and gate counts. For example, some I/Os are constructed as in-line circuits, while others are staggered. Some I/Os may include different features such as LVDS or PCI-compliant circuits or circuits used to implement other standards. Some higher density I/O circuits require that electrostatic discharge (ESD) protection circuits be reduced or eliminated to allow more space on the chip for more I/O circuits. Therefore, with prior art systems, there is often a trade-off between ESD protection and the number of available I/O circuits. Another solution is to use so-called I/O immersion where I/Os can be programmed anywhere in the FPGA fabric, thereby decoupling the number of I/Os from the number of gates, because the I/O circuits are not limited to the perimeter of the device. This solution however requires flip-chip packaging. Flip-chip packaging is the art of bonding pads distributed anywhere on the face of an IC directly to a package without use of wires. Flip-chip packaging, presently and in the reasonably-foreseeable future, will still add enough cost to the product to offset any cost savings realized from the solution.

The industry in general is looking at a number of so-called 3-D packaging variations. None of these variations are employing 3D packaging to solve the above-described I/O problem.

BRIEF DESCRIPTION OF THE INVENTION

An integrated circuit system includes a first set of integrated circuit dice each member of the set having a different configuration of input/output circuits disposed thereon and a second set of integrated circuit dice each having different logical function circuits disposed thereon. Each member of the first and second sets of integrated circuit dice include an array of face-to-face bonding pads disposed thereon that mate with the array of face-to-face bonding pads of each member of the other set.

According to various embodiments of the present invention, the logical function circuits may include a programmable logic array such as an FPGA array, the first integrated circuit die may include other digital, analog, and/or interface circuits in addition to the input/output circuits.

BRIEF DESCRIPTION OF THE DRAWING FIGURES

DETAILED DESCRIPTION

Figure 1:
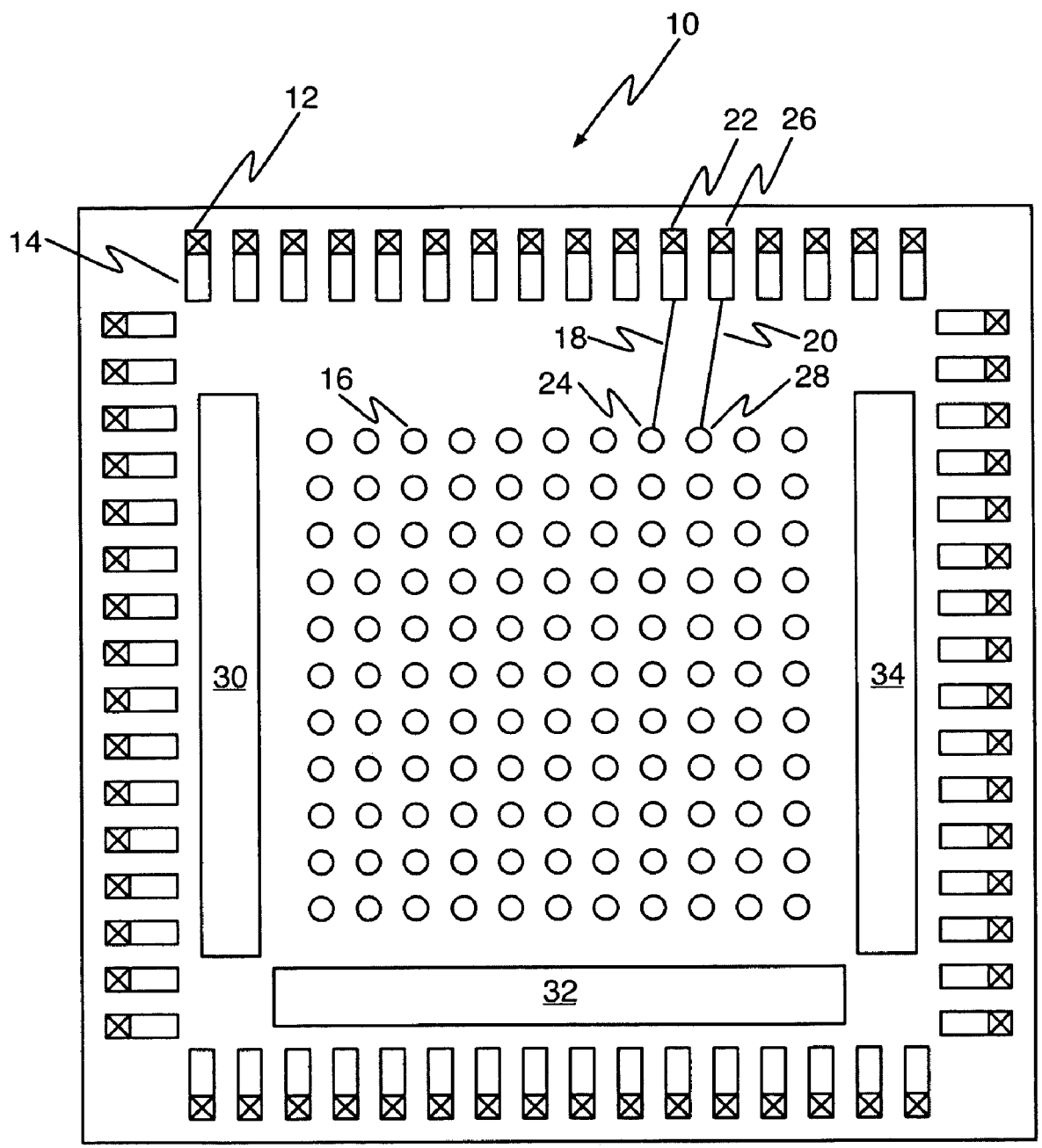
FIG. 1 is a top view of an illustrative input/output integrated circuit die that may be used in an integrated circuit system according to the principles of the present invention.

Those of ordinary skill in the art will realize that the following description of the present invention is illustrative only and not in any way limiting. Other embodiments of the invention will readily suggest themselves to such skilled persons.

The I/O circuit portion of an FPGA can be manufactured on mature processes because, among other reasons, a system designer requires higher voltage board signaling than that needed for the FPGA core. That is, while the FPGA may operate at one voltage such as 1.5 volts, the I/O circuits may need to be able to operate at other voltages such as, for example, 3-5 volts, to handle various customer applications.

Wafer prices for circuits manufactured using such mature processes are typically steeply discounted relative to leading-edge processes. For example, at a time when 90 nm feature size is the leading edge of FPGA processes, an I/O chip for a 90 nm FPGA device may be produced using a 180 nm process. Mature processes can support higher voltages due to the thicker oxides used. In one embodiment of the invention, different I/O chips may be provided for face-to-face bonding with the FPGA chip based on the voltage required by the customer application.

According to the present invention, an integrated circuit system includes a plurality of first integrated circuit die including I/O circuits, each one having a different I/O count. The I/O circuits may preferably be located on the periphery of the die and are available for wire bonding. The I/O circuits may preferably be fabricated using a mature process node.

The integrated circuit system of the present invention also includes a plurality of second integrated circuit die including digital programmable logic device circuits, each one having a different gate count. The digital integrated circuits may preferably be fabricated using a leading-edge process node.

Face-to-face bonding pads on each of the first and second integrated circuit dice are disposed in the center portion of the first and second integrated circuit die. The face-to-face bonding pads on each of the first and second integrated circuit dice are matingly located with respect to one another and are distributed so that a second integrated circuit die, for example an FPGA which may preferably be fabricated using a leading edge process so as to minimize cost/gate, can be bonded to the first IO die. The face-to-face bonding pads may be disposed in a layout pattern that allows different gate-count FPGA integrated circuit die to be face-to-face bonded to different I/O circuit die.

According to the present invention, a device manufacturer can offer customers choices of purchasing various numbers of I/O circuits for a product with a given gate count, without having to manufacture different versions of that product at the wafer level. In this way, a customer could purchase a product having both a desired gate count and a desired number of I/O circuits, without having to compromise cost by purchasing an un-needed number of one in order to obtain the desired number of the other. As will be appreciated by persons of ordinary skill in the art, the present invention applies to ASIC integrated circuits, SOC integrated circuits or other functional types of integrated circuits in addition to programmable logic devices such as FPGAs.

Referring first to FIG. 1, a top view is shown of an illustrative input/output integrated circuit die 10 that may be used in an integrated circuit system according to the principles of the present invention. Input/output integrated circuit die 10 includes a plurality of input/output pads 12 disposed about its periphery as is known in the art. These input/output pads may be used to accept connecting wires that may be attached using integrated-circuit wire-bonding techniques to make connections through an integrated-circuit package (not shown in the figure) to off-chip circuitry as is known in the art. The package seals the integrated circuit to protect it from the outside environment as is known in the art.

The input/output pads 12 are electrically connected to input/output circuits 14. Input/output circuits 14 may include buffers, level-shifting circuits and other digital signal conditioning circuitry as is known in the art. The particular composition of the input/output circuits 14 in an integrated circuit fabricated according to the principles of the present invention will be a matter of design choice made by persons of ordinary skill in the art and dictated by the application in which the integrated circuit system of the present invention is used.

Depending on the I/O density required by the application, the input/output circuits 14 may be arranged, for example, in more than one concentric "ring" with the outermost one of the rings being located inward from the edges of the integrated circuit die, and the next ring being located inward of the input/output circuits in the outer ring.

Also included on input/output integrated circuit die 10 is an array of face-to-face bonding pads, one of which is identified at reference numeral 16. These face-to-face bonding pads may be fabricated and configured as is known in the art of face-to-face integrated circuit bonding techniques. The number of face-to-face bonding pads that will be used in an array of face-to-face bonding pads in the integrated circuit system of the present invention is a matter of design choice dictated by the connectivity needs encountered in the system. The placement pattern of the face-to-face bonding pads in the array of face-to-face bonding pads is not critical and need only be configured to permit mating face-to-face bonding pads of a second integrated circuit die to be face-to-face bonded to input/output integrated circuit die 10.

In a standard integrated circuit, the input/output circuits 14 would be connected to internal circuitry on the integrated circuit to which they would either drive signals to from off-chip sources or from which they would receive signals to be driven to off-chip signal loads via the input/output pads 12. However, in the integrated circuit system of the present invention, the input/output circuits 14 are connected to ones of the face-to-face bonding pads to which they either drive signals routed through the input/output pads 12 and the input/output circuits 14 from the off-chip sources or from which they would receive signals from a second integrated-circuit die that is bonded thereto to be driven to off-chip signal loads through the input/output circuits 14 via the input/output pads 12. Accordingly, illustrative electrical connections 18 and 20 are shown, respectively, made between face-to-face bonding pad 22 and input/output circuit 24 and face-to-face bonding pad 26 and input/output circuit 28.

As is known in the programmable logic device art, the input/output circuits 14 may be configured as a mix of fixed input circuits and output circuits or may be configurable as to one or more of input function or output function, logic level definition, signal conditioning, etc., as is known in the art. The programming of these functions may be set by register bits as is also known in the art. The programming registers may either be contained within each programmable input/output circuit or may be configured separately as programming registers 30, 32, and 34 shown in FIG. 1.

Programming registers 30, 32, and 34 may be coupled to the input/output circuits to define such functions and parameters, as is known in the art. As will be appreciated by persons of ordinary skill in the art, such programming registers are in general use in the industry and the loading of the programming registers can be accomplished by using techniques known for programming such programmable registers and programmable logic devices in general. Such techniques include, but are not limited to, coupling the registers together to a JTAG port on the integrated circuit die 10 that is coupled to the input/output pads, coupling the registers to other circuitry to be programmed and located on the integrated circuit die 10 or on the integrated circuit to be mated with the input/output circuit integrated circuit die 10. The registers could be coupled to, for example, an FPGA programming circuit contained on the integrated circuit die 10 or on the logic-function integrated-circuit die to which the integrated circuit die 10 of FIG. 1 will be mated through the face-to-face interface. The register bits could be loaded from non-volatile memory such as flash memory disposed on the integrated circuit die 10 or on the logic-function integrated-circuit die to which the integrated circuit die of FIG. 1 will be mated through the face-to-face interface. Finally, persons of ordinary skill in the art will appreciate that the function of the registers could instead be performed by programmed signals coming from the FPGA via additional face to face bonding pads.

Figure 2:
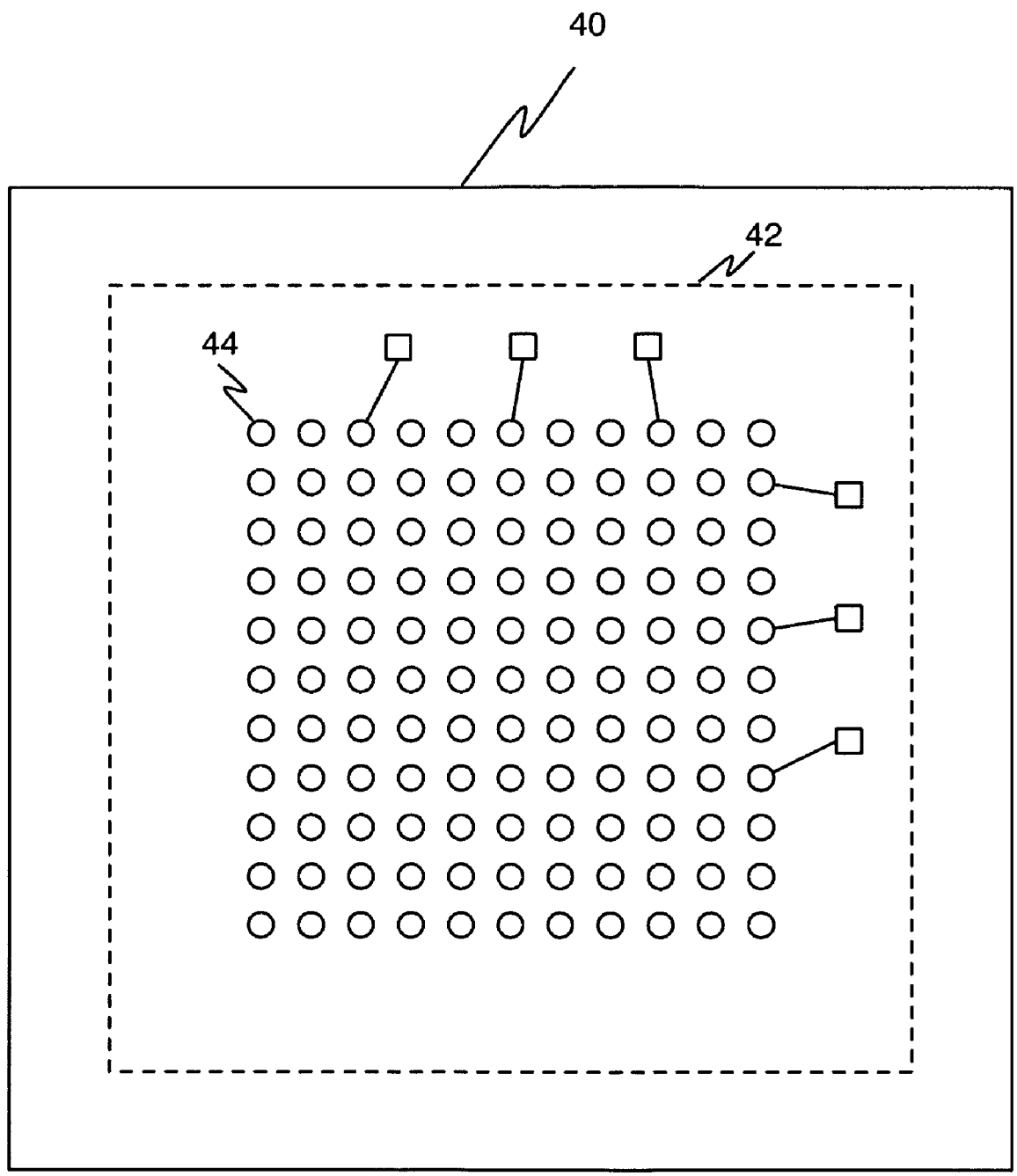
FIG. 2 is a top view of an illustrative logic-function or other-function integrated circuit die that may be used in an integrated circuit system according to the principles of the present invention.

Referring now to FIG. 2, a top view is shown of an illustrative logic-function integrated-circuit die 40 that may be used in an integrated circuit system according to the principles of the present invention. Logic-function integrated-circuit die 40 includes a logic function circuit 42 (shown in dashed lines) that may be, for example, a programmable logic array or an FPGA.

Like input/output circuit integrated circuit die 10 of FIG. 1, logic-function integrated-circuit die 40 of FIG. 2 includes an array of face-to-face bonding pads, one of which is identified at reference numeral 44. These face-to-face bonding pads are oriented to mate with the array of face-to-face bonding pads of input/output integrated circuit die 10 of FIG. 1. Illustrative ones of both the face-to-face bonding pads and circuit elements of the logic function circuit 42 (illustrated as small squares within dashed line rectangle 42) are shown connected together. Persons of ordinary skill in the art will appreciate that the circuit elements of the logic function circuit 42 represented by the small squares could be any of a wide variety of circuit elements including, but not limited to, input and output buffers and other circuits.

Persons of ordinary skill in the art will appreciate that, while the present disclosure is made using the example of a logic-function circuit, the integrated-circuit system of the present invention may be practiced using integrated circuits other than what have been referred to herein as logic-function circuits. For example, SOC integrated circuits are becoming more prevalent. Such SOC integrated circuits are likely to have the same I/O variability issues as do FPGA integrated circuits. The present invention is meant to encompass such integrated circuits as well as other integrated circuits that may benefit from an ability to customize the number of I/O lines available to a user.

As noted above, other circuitry may be advantageously disposed on the input/output integrated-circuit die of the integrated circuit system of the present invention. This aspect of the invention is illustrated in FIG. 3, which is a top view of another illustrative input/output integrated circuit die including additional functional circuits that may be used in an integrated circuit system according to the principles of the present invention.

Figure 3:
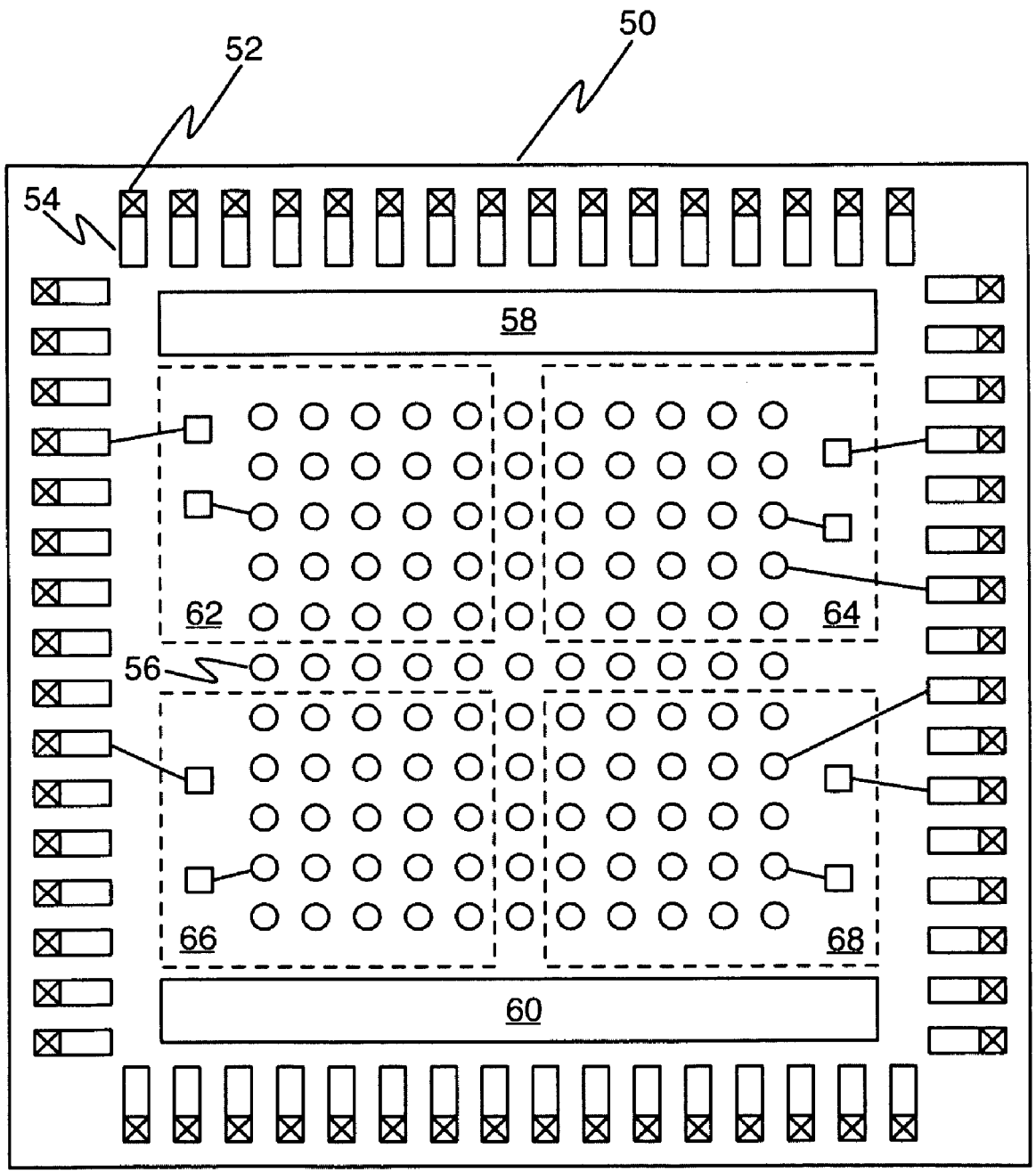
FIG. 3 is a top view of another illustrative input/output integrated circuit die including additional functional circuits that may be used in an integrated circuit system according to the principles of the present invention.

Referring now to FIG. 3, an input/output integrated circuit die 50 is shown. Like the input/output integrated circuit die 10 of FIG. 1, input/output integrated circuit die 50 includes a plurality of input/output pads 52 disposed about its periphery as is known in the art. These input/output pads may be used to accept connecting wires that may be attached using integrated-circuit wire-bonding techniques to make connections through an integrated-circuit package (not shown in the figure) to off-chip circuitry as is known in the art. The package seals the integrated circuit to protect it from the outside environment as is known in the art.

As in the embodiment of FIG. 1, the input/output pads 52 are electrically connected to input/output circuits 54. Input/output circuits 54 may include buffers, level-shifting circuits and other digital signal conditioning circuitry as is known in the art. The particular composition of the input/output circuits 54 in an integrated circuit fabricated according to the principles of the present invention will be a matter of design choice made by persons of ordinary skill in the art and dictated by the application in which the integrated circuit system of the present invention is used.

Also included on input/output integrated circuit die 50 is an array of face-to-face bonding pads, one of which is identified at reference numeral 56. These face-to-face bonding pads may be fabricated and configured as is known in the art of face-to-face integrated circuit bonding techniques. Configuration registers 58 and 60 are shown for the case where the input/output circuits 54 are configurable as was disclosed with reference to FIG. 1.

In addition to these features of the input/output integrated circuit die 50 that are common with the embodiment of FIG. 1, input/output integrated circuit die 50 may include other circuitry. As will be appreciated by persons of ordinary skill in the art, the array of face-to-face bonding pads is disposed on an upper layer of the integrated circuit die separated from the underlying semiconductor substrate by insulating layers and metal interconnect layers and does not occupy any of the underlying semiconductor substrate. Thus this region of the substrate is available for other circuitry. Accordingly, circuit blocks 62, 64, 66, and 68 are shown as dashed-line rectangles disposed generally under the array of face-to-face bonding pads in the central portion of FIG. 3. Input and output circuit elements of these circuit blocks 62, 64, 66, and 68 are shown as small squares disposed therein and are illustrated as having exemplary connections to ones of the face-to-face bonding pads and ones of the input/output circuits. Persons of ordinary skill in the art will appreciate that these circuit elements represent such things as input buffer inputs, output buffer outputs, digital inputs and outputs, analog inputs and outputs, etc., as would be encountered depending on the nature of individual ones of circuit blocks 62, 64, 66, and 68.

According to the present invention, numerous kinds of circuit blocks 62, 64, 66, and 68 may be advantageously disposed in this region under the face-to-face bonding pads. Such circuitry includes, but is not limited to circuit functions such as analog function circuits, digital-to-analog converter circuits, analog-to-digital converter circuits, voltage-regulator circuits, programming control circuits for programmable logic devices, such as FPGA circuits to be disposed on the mating integrated circuit, charge-pump circuits, data-conditioning circuits, serializer/deserializer (SERDES) circuits that perform self-clocked serial-to-parallel conversion, industry-standard bus circuits (PCI and the like). Such circuits are well-known in the art and can generally be economically fabricated using mature process technology, thus providing additional cost savings.

In an integrated-circuit system according to the present invention, there are available a plurality of input/output integrated-circuit dice as in FIGS. 1 and 3, each having a different number and/or configuration of input/output circuits and input/output pads. There are also available a plurality of functional-circuit integrated-circuit dice such as illustrated in FIG. 2. The patterns of the arrays of face-to-face bonding pads on each of the plurality of input/output integrated-circuit dice and the plurality of functional-circuit integrated-circuit dice are arranged so as to mate with one another so that any one of the plurality of input/output integrated-circuit dice and the plurality of functional-circuit integrated-circuit dice can be mated to one another. As will be appreciated by persons of ordinary skill in the art, the number of face-to-face bonding pads on the input/output integrated-circuit die and the functional-circuit integrated-circuit die to be mated need not be the same so long as the array patterns on each are such that the pattern of the die having the smaller number of face-to-face bonding pads can be correctly matingly oriented with a portion of the face-to-face bonding pads on the die having the larger array. This is entirely a geometry exercise and so the mapping of the face-to-face-bonding-pad footprint of the smaller array to a portion of the face-to-face-bonding-pad footprint of the larger array is a trivial layout exercise for persons of ordinary skill in the art.

Figure 4:
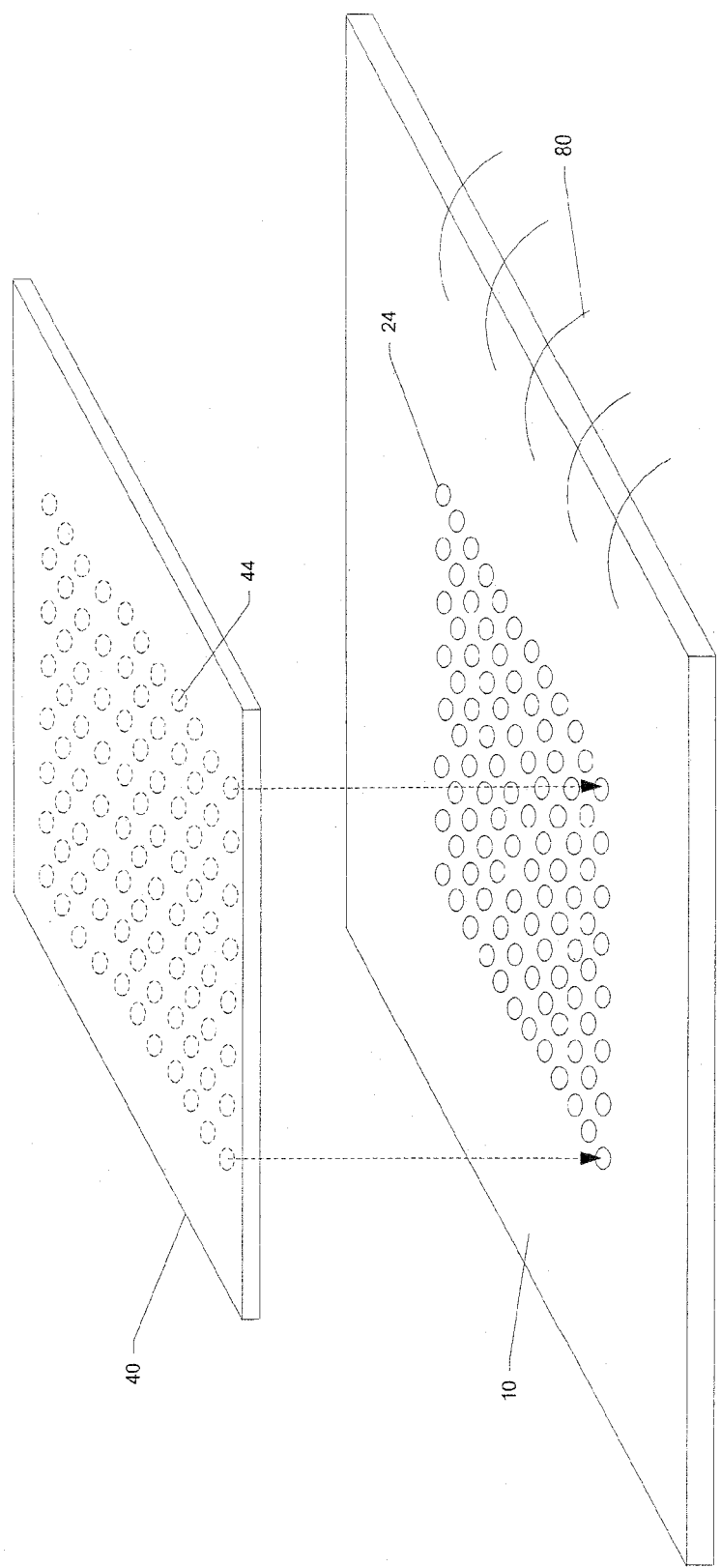
FIG. 4 is a perspective view of an illustrative input/output integrated circuit and a logic-function or other-function integrated circuit die that may be used in an integrated circuit system according to the principles of the present invention.

Referring now to FIG. 4, an expanded perspective view illustrates a logic-function integrated-circuit die 40 being face-to-face bonded to an input/output integrated circuit die 10. Face-to-face bonding pads 24 on the input/output integrated circuit 10 are aligned with face-to-face bonding pads 44 on the logic-function integrated-circuit die 40. The face-to-face bonding pads 44 on the logic function integrated circuit die 40 are illustrated with dashed lines in FIG. 4, indicating that they are actually located on a surface of the logic-function integrated-circuit die 40 facing the top of the input/output integrated circuit die 10. Packaging bond wires 80 are used to connect the input/output integrated circuit 10 to packaging materials, as is known in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit system including:
a first integrated circuit die having a plurality of wire-bonding pads and an array of face-to-face bonding structures disposed on a face thereof, the first integrated circuit die also having only input/output circuits disposed thereon, first ones of the input/output circuits having inputs connected to ones of the wire-bonding pads and outputs connected to ones of the face-to-face bonding structures, and second ones of the input/output circuits having inputs connected to ones of the face-to-face bonding structures and outputs connected to ones of the wire-bonding pads; and
a second integrated circuit die having an array of face-to-face bonding structures disposed on a face thereof, the array of face-to-face bonding structures mating with the array of face-to-face bonding structures disposed on the first integrated circuit die, the second integrated circuit die having only logical function circuits disposed thereon, input elements associated with the logical function circuits coupled to first ones of the face-to-face bonding structures, and output elements associated with the logical function circuits coupled to second ones of the face-to-face bonding structures.

2. The integrated circuit system of claim 1 wherein input/output circuits are disposed in a peripheral portion of said first integrated circuit die and said mating face-to-face bonding pads are disposed on said opposing face of said first integrated circuit die at an interior portion thereof.

3. The integrated circuit system of claim 1 wherein said mating face-to-face bonding are disposed at least partially over said input/output circuits.

4. The integrated circuit system of claim 1 further including additional circuits disposed under said mating face-to-face bonding pads.

5. The integrated circuit system of claim 1 wherein said logical function circuits on said second integrated circuit die include a field programmable gate array.

6. The integrated circuit system of claim 5 further including additional circuits disposed under said mating face-to-face bonding pads.

7. The integrated circuit system of claim 6 wherein said additional circuits include a digital-to-analog converter circuit.

8. The integrated circuit system of claim 6 wherein said additional circuits include an analog-to-digital converter circuit.

9. The integrated circuit system of claim 6 wherein said additional circuits include a voltage-regulator circuit.

10. The integrated circuit system of claim 6 wherein said additional circuits include a field-programmable-gate-array programming-control circuit.

11. The integrated circuit system of claim 6 wherein said additional circuits include at least one charge-pump circuit.

12. The integrated circuit system of claim 6 wherein said additional circuits include a data-conditioning circuit.

13. The integrated circuit system of claim 12 wherein said data-conditioning circuit comprises a serdes circuit.

14. The integrated circuit system of claim 13 wherein said data-conditioning circuit comprises a bus-interface circuit.

15. The integrated circuit system of claim 1 wherein:
at least some of the input/output circuits are programmable, and
program-control registers coupled to the at least some of the input/output circuits are disposed on the first die.

16. An input/output integrated circuit die for use in an integrated-circuit system including:
a plurality of wire-bonding pads disposed on a face thereof;
an array of face-to-face bonding structures disposed on the face thereof said array being arranged in a match pattern;
a plurality of input/output circuits comprising the only circuits on the integrated circuit die, first ones of the input/output circuits having inputs connected to ones of the wire-bonding pads and outputs connected to ones of the face-to-face bonding structures, and second ones of the input/output circuits having inputs connected to ones of the face-to-face bonding structures and outputs connected to ones of the wire-bonding pads.

17. An integrated circuit system including:
a set of first integrated circuit dice, each member of the set of first integrated circuit dice having a plurality of wire-bonding pads and an array of face-to-face bonding structures disposed on a face thereof, each member of the set of first integrated circuit dice also having only input/output circuits disposed thereon, first ones of the input/output circuits having inputs connected to ones of the wire-bonding pads and outputs connected to ones of the face-to-face bonding structures, and second ones of the input/output circuits having inputs connected to ones of the face-to-face bonding structures and outputs connected to ones of the wire-bonding pads, each member of the set of first integrated circuit dice having a different configuration of I/O pad connections; and
a set of second integrated circuit dice, each member of the set of second integrated circuit dice having an array of face-to-face bonding structures disposed on a face thereof that mates with the array of face-to-face bonding structures disposed on each member of the set of first integrated circuit dice, each member of the set of second integrated circuit dice having only different logical function circuits disposed thereon, input elements associated with the logical function circuits of each member of the set of second integrated circuit dice coupled to first ones of the face-to-face bonding structures, and output elements associated with the logical function circuits of each member of the set of second integrated circuit dice coupled to second ones of the face-to-face bonding structures.

18. The integrated circuit system of claim 17 wherein the configuration of I/O pad connections in the first set comprises a different number of I/O connections.

19. The integrated circuit system of claim 17 wherein the logical function circuit of each logical function circuit in the second set is a programmable logic device and each logical function circuit in the second set includes a different number of gates.

* * * * *